(12) United States Patent
Dempsey

(10) Patent No.: US 11,894,158 B2
(45) Date of Patent: Feb. 6, 2024

(54) DIFFUSION WINDOW FOR RADIOACTIVE HEAT SOURCE

(71) Applicant: Lockheed Martin Corporation, Bethesda, MD (US)

(72) Inventor: Brian Paul Dempsey, Littleton, CO (US)

(73) Assignee: Lockheed Martin Corporation, Bethesda, MD (US)

( * ) Notice: Subject to any disclaimer, the term of this patent is extended or adjusted under 35 U.S.C. 154(b) by 478 days.

(21) Appl. No.: 17/150,556

(22) Filed: Jan. 15, 2021

(65) Prior Publication Data

US 2022/0037047 A1 Feb. 3, 2022

Related U.S. Application Data

(60) Provisional application No. 63/058,585, filed on Jul. 30, 2020.

(51) Int. Cl.
| | |
|---|---|
| *G21H 1/10* | (2006.01) |
| *B01D 53/22* | (2006.01) |
| *B01D 59/14* | (2006.01) |
| *G21F 5/015* | (2006.01) |
| *H10N 10/13* | (2023.01) |

(52) U.S. Cl.
CPC ............ *G21H 1/103* (2013.01); *B01D 53/22* (2013.01); *B01D 59/14* (2013.01); *G21F 5/015* (2013.01); *H10N 10/13* (2023.02); *B01D 2256/18* (2013.01); *B01D 2311/10* (2013.01); *B01D 2325/02* (2013.01); *B01D 2325/22* (2013.01)

(58) Field of Classification Search
None
See application file for complete search history.

(56) References Cited

U.S. PATENT DOCUMENTS 3,133,196 A * 5/1964 Rochlin ................. G21H 1/103
250/493.1
2015/0151242 A1 * 6/2015 Nagano ................. B01D 71/027
427/245

* cited by examiner

*Primary Examiner* — Jason M Greene

(57) ABSTRACT

Sealed containers for radioactive material are presented herein. A sealed container forms an interior envelope for housing a radioactive material and prevents escape of the radioactive material into a surrounding environment. The sealed container provides a diffusion window for gaseous decay products to escape at a particular diffusion rate. In one example, an apparatus, comprises a container forming a sealed interior envelope for a radioactive material. The container has an aperture covered by a window material, and properties of the window material are selected to provide for diffusion of at least one gas produced by radioactive decay of the radioactive material.

20 Claims, 4 Drawing Sheets

DIFFUSION WINDOW FOR RADIOACTIVE HEAT SOURCE

RELATED APPLICATIONS

This application hereby claims the benefit of and priority to U.S. Provisional Patent Application 63/058,585, titled "HELIUM-3 DIFFUSION WINDOW FOR TRITIUM HEAT SOURCE," filed Jul. 30, 2020, which is hereby incorporated by reference in its entirety.

TECHNICAL BACKGROUND

Radioisotope thermoelectric devices, such as radioisotope thermoelectric generators (RTG), can be employed to produce usable energy for target devices. For example, RTGs can generate heat via radioactive decay processes, and this heat can be captured or converted into other forms of energy to provide heat and power to target devices. Radioisotope thermoelectric devices can also be employed as long-term heat sources for cold space environments. In such examples, target devices can include various space-faring devices, satellites, space probes, landers, rovers, orbiters, or other spacecraft. However, transport and housing of such RTG devices and associated radioactive materials can be difficult.

Many radioactive materials decay by emitting alpha particles which become helium atoms. One radioactive material (tritium) decays by emitting a beta particle (an electron) whereupon the tritium atom becomes helium 3, a stable isotope of helium. Thus, a sealed container of certain radioactive materials will accumulate pressure as the radioactive decay processes continue to generate helium. If left unvented, a sealed container will eventually destructively burst and potentially distribute radioactive material into the surrounding environment. However, venting a sealed container to prevent such destructive bursting can still allow unwanted release of radioactive material into the surrounding environment.

Overview

Sealed containers for radioactive material are presented herein. A sealed container forms an interior envelope for housing a radioactive material and prevents escape of the radioactive material into a surrounding environment. The sealed container provides a diffusion window for isotopes of helium to escape at a particular diffusion rate. In one example, an apparatus, comprises a container forming a sealed interior envelope for a radioactive material. The container has an aperture covered by a window material, and properties of the window material are selected to provide for diffusion of at least one isotope of helium produced by radioactive decay of the radioactive material. The window material can comprise monolithic materials or laminated structures to control diffusion rates while providing structural support for the diffusion material. Moreover, diffusion rates through the diffusion material can be controlled by selective application of heat or energy to the diffusion material, such as by heating elements, laser elements, or other elements.

In another example, a sealed container forms an interior envelope for housing a radioactive material. The container has at least one aperture covered by a material. The material that covers the aperture, such as a glass material, allows diffusion to an exterior environment of isotopes of helium produced by radioactive decay of the radioactive material. One or more properties of the glass material, such as material type, thickness, size, dimensions, shape, laminations, among other properties, can be selected to provide a diffusion rate of the isotope of helium through the material of the window approximately commensurate with the production rate of the isotope of helium from the radioactive decay, or to keep a pressure inside the container to below a threshold pressure level. An energy conversion device can convert an energy output of the radioactive material, such as heat energy or beta decay energy, into electrical energy for use by a target device.

This Overview is provided to introduce a selection of concepts in a simplified form that are further described below in the Detailed Description. It may be understood that this Overview is not intended to identify key features or essential features of the claimed subject matter, nor is it intended to be used to limit the scope of the claimed subject matter.

BRIEF DESCRIPTION OF THE DRAWINGS

Many aspects of the disclosure can be better understood with reference to the following drawings. While several implementations are described in connection with these drawings, the disclosure is not limited to the implementations disclosed herein. On the contrary, the intent is to cover all alternatives, modifications, and equivalents.

DETAILED DESCRIPTION

Figure 1:
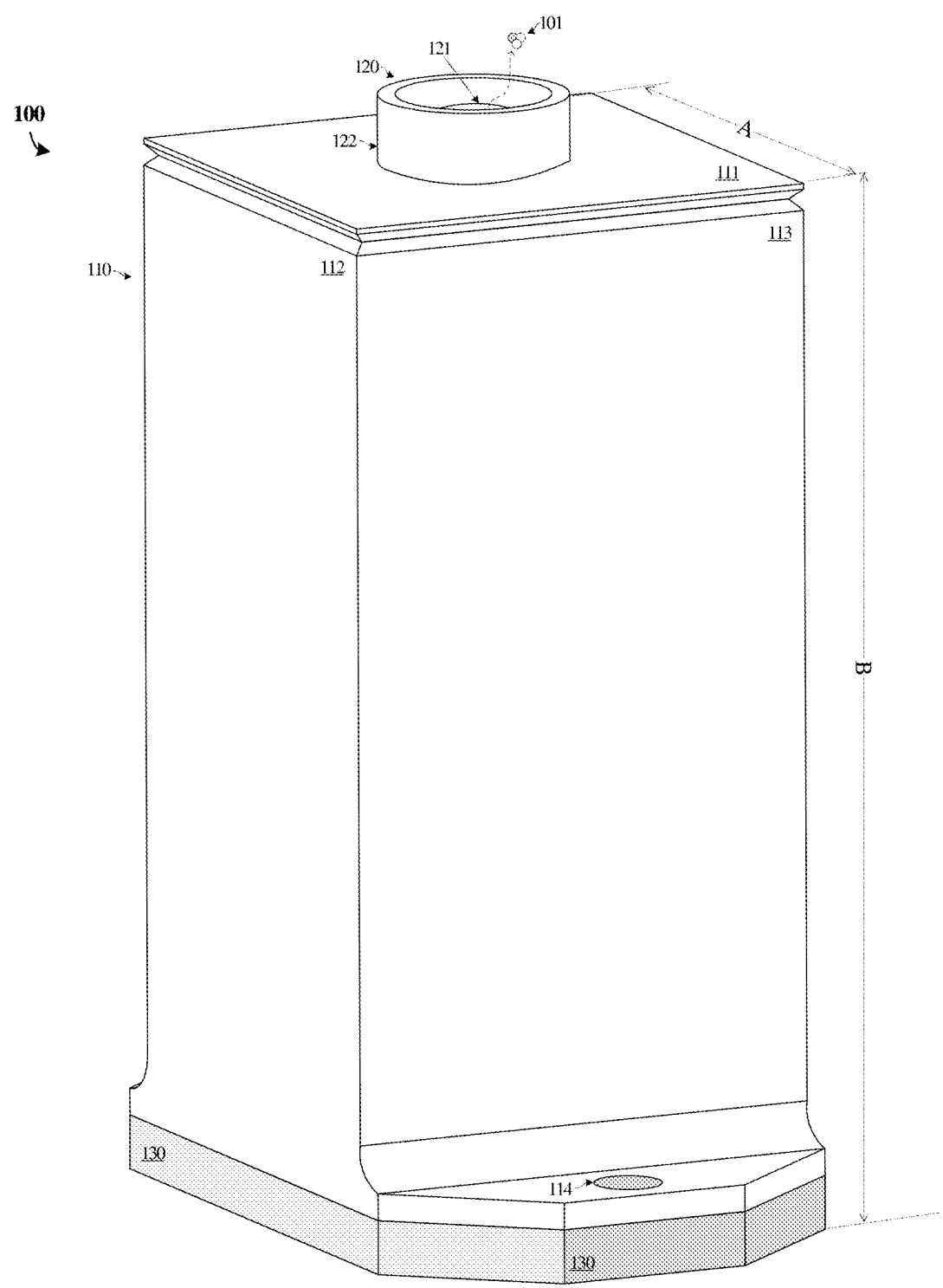
FIG. 1 illustrates a containment system in an implementation.

Radioisotope thermoelectric devices, such as radioisotope thermoelectric generators (RTG), can be employed to produce usable energy for target devices. For example, RTGs can generate heat via radioactive decay processes, and this heat can be captured or converted into other forms of energy to provide heat and power to target devices. Radioisotope thermoelectric devices can also be employed as long-term heat sources for cold space environments. In such examples, target devices can include various space-faring devices, satellites, space probes, landers, rovers, orbiters, or other spacecraft. However, transport and housing of such RTG devices can be difficult. Other devices can employ radioactive materials for energy sources, such as betavoltaics. In betavoltaics, electric current can be generated from beta particles (electrons) emitted from a radioactive source, using semiconductor junctions. Moreover, energy sources need not be employed, and containers which just house radioactive materials can be employed in the examples herein.

Tritium, an isotope of hydrogen, is among the various radioisotopes suitable for electrical power applications. Tritium can be used as a radioactive heat source for RTGs in the milliwatt range, or in betavoltaics, among others. However since tritium is a radioactive isotope, government regulations typically require the tritium source to be in a sealed enclosure, so the associated radioactivity does not pose a health hazard to the surrounding environment and to personnel. Advantages of sealed containers is to prevent tampering and prevent leaks of radioactive materials. Tritium is chemically identically to hydrogen and can be stored by combining it with a metal, such as by absorption, to form a metallic hydride. Metallic hydrides allow for tritium or other similar materials to be contained in higher quantities for a given volume and pressure. One example metallic hydride uses titanium and tritium to form titanium hydride, referred to as tritide. The examples herein are not limited to tritium and tritide, and can apply as well to any material that produces alpha particles during decay, such as plutonium. However, when metallic hydrides are exposed to vacuum or very low pressure environments, the absorbed material can exit the metallic material rapidly. Thus, in space or other vacuum environments, sealed containers are desired to prevent exposure to vacuum.

Being a radioactive isotope, tritium will decay over time by transmuting into an isotope of helium, such as helium-3 (He-3), while emitting beta particles (electrons) and electron antineutrinos. He-3 is typically found as a gas. As time passes, a sealed container housing a metal hydride made with tritium, such as tritide, will accumulate pressure as the decay process continues to produce gaseous decay products. If left unvented, a sealed container can eventually burst, damaging the container and potentially damaging the target device. Moreover, the damaged container can allow unwanted release of radioactive material or radiation into the surrounding environment. Thus, any container that is sealed for safety from the radioactive decay of tritium will face a danger of bursting due to production of helium-3. In some isolated environments, such as government labs, tritium may not need a sealed container, and small filtered vents or holes can be provided for tritium enclosures to allow escape of helium-3 gas. Other solutions include simply building sealed containers that can withstand a large pressure build up over the lifetime of the RTG device. However, adding vents and withstanding large pressures is undesirable in applications where mass, mobility, or size/volume is a concern, such as in space vehicles. Advantageously, the examples herein discuss containers sealed to tritium that also allow expulsion of helium-3 or other gaseous decay products.

Isotopes of helium, such as helium-3 (He-3) and helium-4 (He-4) diffuse through many types of glass and polymers. In radioactive decay settings, the He-4 nucleus can also be referred to as an alpha particle. Glass and polymers also can provide a sealed environment for materials, such as tritium in a hydride configuration. The examples herein employ a container that is sealed to tritium, or other radioactive materials, and is still permeable to gaseous decay products such as helium-3 or helium-4 (alpha particles). Moreover, the examples herein employ a window that is sized to allow gaseous decay products to pass through the window at a rate equal to a decay production rate of the contained material. A container that houses tritium, which decays into helium-3, can have a glass or polymer window sized to accommodate a production rate of helium-3 by the tritium and maintain the pressure within the container to below a threshold pressure. Advantageously, a container can be sealed to a first material (e.g. tritium or tritide) while allowing diffusion or escape of a second material to prevent accumulation of the second material (e.g. helium isotopes) above a certain quantity or certain pressure. This can lead to reductions in mass and size of containers that house radioactive materials by eliminating excess container material, complex and unreliable venting, or complex burst-prevention mechanisms.

The diffusion referred to herein does not refer to fluid flow of a gas or liquid through gaps in a material, such as through conduits, apertures, grids, valves, filters, pores, or other bulk material passages. Instead, diffusion refers to permeation of a target material (e.g. gas) through a barrier material (e.g. solid). These target materials can be atomic or molecular in form, such as nucleus material of various isotopes. Thus, the barrier material might be referred to as a membrane or interface capable of absorption/desorption of the target material. Moreover, only specific target materials might be capable of diffusion through the barrier material. In the examples herein, isotopes of helium (e.g. helium-3 and helium-4) experience diffusion through the barrier material.

The material used for the window can comprise various types of glass or polymers, among other materials that can be dependent upon the materials housed inside the container. The selected window material should allow diffusion or permeation of the gaseous material in the container, while providing a physical barrier to other materials and to fluid flow. Thus, a container can be sealed to all material flow, except helium isotope decay products which slowly diffuse through the window material. The thickness of the window material can be determined based on a selected diffusion rate, material strength, geometry of the window and container, the expected vibrational or thermal environment of the target device or RTG, or other factors. Example window materials include silicon dioxide ($SiO_2$), silica glass, silicate glass, fused silica, quartz, soda-lime glass, borosilicate glass, Pyrex, alumosilicate glass, aluminoborosilicate glass, lead glass, or other glass and polymeric material that allows for diffusion of helium decay products. Borosilicate glass materials, such as Pyrex, typically have slower diffusion rates than other types of glass materials, such as $SiO_2$ or fused silica. Plastic or polymer window materials (e.g. Viton, fluoropolymer elastomer, or silicone) can be employed when the material supports a suitable diffusion rates of isotopes of helium and can withstand target temperatures and pressures. The window material can be selected based on the diffusion properties or diffusion rate for the particular gas to be diffused. The window material can be combinations of various materials, with impurities or dopants included to alter the mechanical or diffusion properties thereof.

FIG. 1 illustrates containment system 100. Containment system 100 comprises container 110 having aperture 120, and container 110 is coupled to pedestal 130. Container 110 forms an internal envelope or space for a material to be housed, an internal cross-sectional view of such is presented in FIG. 2. Sides 111-113 are shown in FIG. 1 which form a housing. Pedestal 130 provides mounting and thermal isolation features for container 110, provided on the bottom of container 110 in FIG. 1.

Aperture 120 comprises a window or port for container 110. Aperture 120 comprises diffusion window 121, along with structural support 122 into which diffusion window 121 is mounted. Diffusion window 121 comprises a window formed from a glass or polymeric material that allows diffusion of helium within the envelope of container 110 to a surrounding environment. One example gas includes He-3 that is formed as a decay product of tritium, and example He-3 particle 101 is shown in FIG. 1 escaping via diffusion from container 110. Another example gas includes He-4 (or alpha particles) formed as a decay product of other radioactive materials. Diffusion window 121 can be sized to generally match a diffusion rate of the gas through the glass material to a production rate of the gas by the radioactive material. For example, a production rate of He-3 by the tritium housed within the container can be determined and the sizing of diffusion window 121 can accommodate a diffusion of He-3 commensurate with this production rate. In other examples, the sizing of diffusion window 121 can be determined to keep a pressure accumulated in the container below a threshold pressure level. This threshold pressure level can be determined based on the materials used for the container, window, welds, and any seals or gaskets. This threshold pressure level can take into account safety margins, expected lifetimes of the corresponding RTG or target device, human-safety factors, and other factors.

Aperture 120 is included in top face 111 of container 110. However, aperture 120 can be located on any face/side of container 110. In some examples, aperture 120 can be located on any side/location of container 110 that can access the internal envelope of container 110 and provide a passage for internal gas to the external environment. For example, while aperture 120 is located on a particular face or side of container 110, aperture 110 may have associated piping/plumbing to locate diffusion window 121 to a convenient location when the envelope is housed deeply within a corresponding machine, assembly, or structure, or to prevent liquid within the envelope from impacting diffusion window 121 by employing one or more fluid traps or serpentine piping routes.

Container 110 comprises a hermetically sealed case which prevents escape of any material housed within an internal envelope, except for diffusion of isotopes of helium through diffusion window 121. In FIG. 1, container 110 has a width of A and a height of B. In one example, dimension A=0.90 inches and dimension B=2.00 inches. The form factor of container 110 can be selected to match that of other structures, fit or mate within another assembly, or upon other considerations. For example, the form factor might conform to any suitable battery cell form factor, and external surfaces of container 110 or aperture 120 might be configured to conduct electrical energy to external devices. The material selected for container 110 can comprise various materials. One example material can comprise SAE 316L grade stainless steel, among other forms of stainless steel. An example thickness can include 1 millimeter. It should be understood that other materials, metals, polymers, thicknesses, dimensions, and shapes of containers can be employed for the examples herein.

Pedestal 130 comprises a mounting feature for coupling container 110 to other assemblies. Moreover, pedestal 130 can be configured to be thermally and/or electrically isolating. When employed as an RTG, container 110 might house radioactive material from which thermal energy is extracted and converted into electrical energy. To increase efficiency of the conversion of thermal energy, pedestal 130 can be configured to be thermally isolating to direct thermal energy to conduct through other portions of container 110 (or internal features thereof) to reach a thermal-to-electrical conversion element. Materials selected for pedestal 130 can comprise various thermally or electrically isolating materials, such as various polymers, plastics, rubber, silicone, carbon composite, Teflon, nylon, ceramics or other similar materials. Mounting holes 114 can be included on container 110 and pedestal 130 through which containment system 100 can mount to another assembly, or by which container 110 and pedestal 130 can be mounted to each other.

Figure 2:
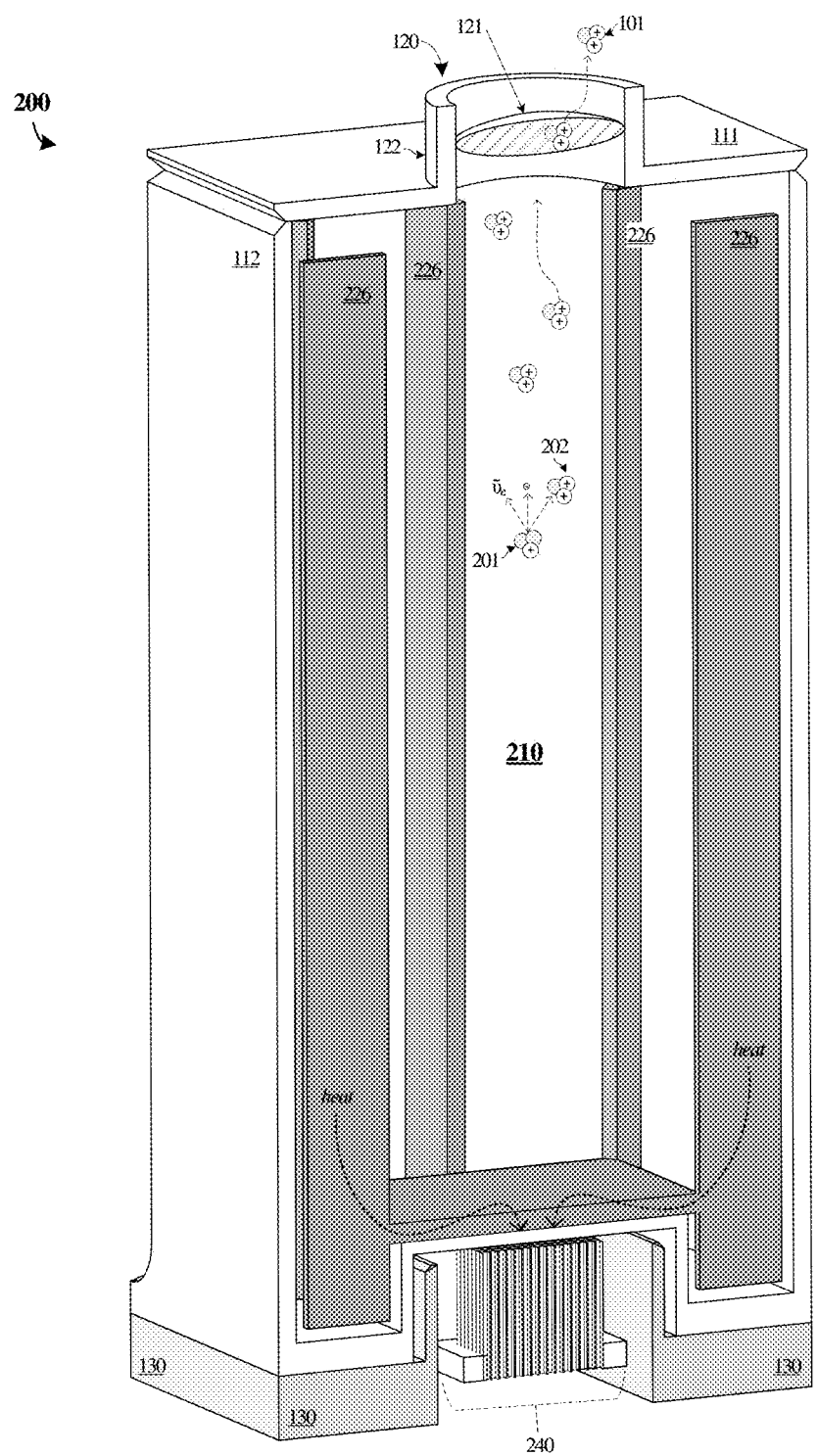
FIG. 2 illustrates a cross-sectional view of a containment system in an implementation.

FIG. 2 illustrates cross-sectional view 200 of container 110 which highlights internal envelope 210. As also shown above, container 110 comprises aperture 120 and is coupled to pedestal 130. Container 110 forms internal envelope 210 for a material to be housed. In this example, the material corresponds to a radioactive material, namely tritium. Container 110 includes a volume of tritium of 1.078 $in^3$ in this example, which is shown as exemplary (not to scale) tritium particle 201. This volume may be pure tritium, or may be tritium introduced into a metallic substance to form a hydride. Various other components are included with container 110 to form an RTG device. This RTG device has a sealed outer case formed from at least elements 111-113 and aperture 120, and includes various internal elements such as copper (Cu) heat spreaders 226, pedestal 130, thermoelectric generator (TEG) 240, and other features. The outer case is sealed from gas, liquid, and solid penetration or intrusion using the material of the case as well as welded lid 111. Diffusion window 121 is included which comprises a glass material through which a gas can diffuse. This gas, as mentioned herein, can comprise a byproduct of radioactive decay of the tritium or other radioactive material.

A heat energy module can be included, shown as TEG 240 in FIG. 2. In one implementation, container 110 comprises thermally-conductive heat spreaders 226 which conduct or channel heat from the tritium decay to TEG 240. TEG 240 comprises an energy conversion unit to convert heat into electricity. In other examples, other energy conversion devices instead of TEG 240 can be included. For example, heat energy from container 110 might be carried away from conductor 110 and into the surrounding environment via radiation, convection, or conduction, such as when container 110 is employed as a heat source for a vehicle or environment. Other energy conversion units can comprise betavoltaic devices, arrays of thermocouples, thermopiles, Sterling engines, Peltier effect devices, or Thomson effect devices. Various thermal and electrical interfacing components and materials can be employed to conduct heat to the energy conversion unit and to conduct electrical current to target devices.

As seen in FIG. 2, example tritium particle 201 (as well as a population of tritium) is housed in internal envelope 210. Tritium particle 201 can decay via radioactive processes into He-3 particle 202. Over time, an accumulation of He-3 particles will be present within internal envelope 210 from decay of many particles of tritium. This accumulation can create a pressure within container 110. If left unchecked, this pressure can lead to leaking, bursting, or other unwanted effects. As mentioned above, some containers might include relief valves or be constructed to thick, overbuilt, materials to prevent bursting or leaking over the expected lifetime of the container. However, container 110 has aperture 110 which comprises diffusion window 121. He-3 particles, such as He-3 particle 202, can diffuse through the material that comprises diffusion window 121. Thus, He-3 particle 101 can escape from internal envelope 210, while internal envelope 210 remains hermetically sealed to the external environment for radioactive material. Other examples might have He-4 as a decay product, among other particle types, and the material selected for diffusion window 121 can provide for a desired diffusion property and rate for desired particles.

When employed in RTG applications, container 110 includes features to direct or conduct heat to a desired location or to conduct primarily through a selected container wall. In FIG. 2, these features include heat spreaders 226, as well as the geometry/location of heat spreaders 226 in combination with a thermally insulating pedestal 130 to direct heat flow through a bottom wall of container 110. The material of heat spreaders 226, namely copper or other suitable metal, conduct heat readily, and take up the heat from the nearby radioactive decay. Heat spreaders 226 have gaps between the material of the spreaders and the walls of container 110 which surrounds the material. These gaps reduce the efficiency of heat transfer to the walls of container 110, while forming a heat-conducting connection at the bottom wall of container 110 which channels or directs the heat to TEG 240. The gaps between heat spreaders 226 and the walls of container 110 can include vacuum, gas, or heat-insulating material such as foam. Thus, heat energy produced by the radioactive decay of the radioactive material in container 110 is coupled through a bottom wall of container 110 to TEG 240 to convert the heat energy to electrical energy.

Figure 3:
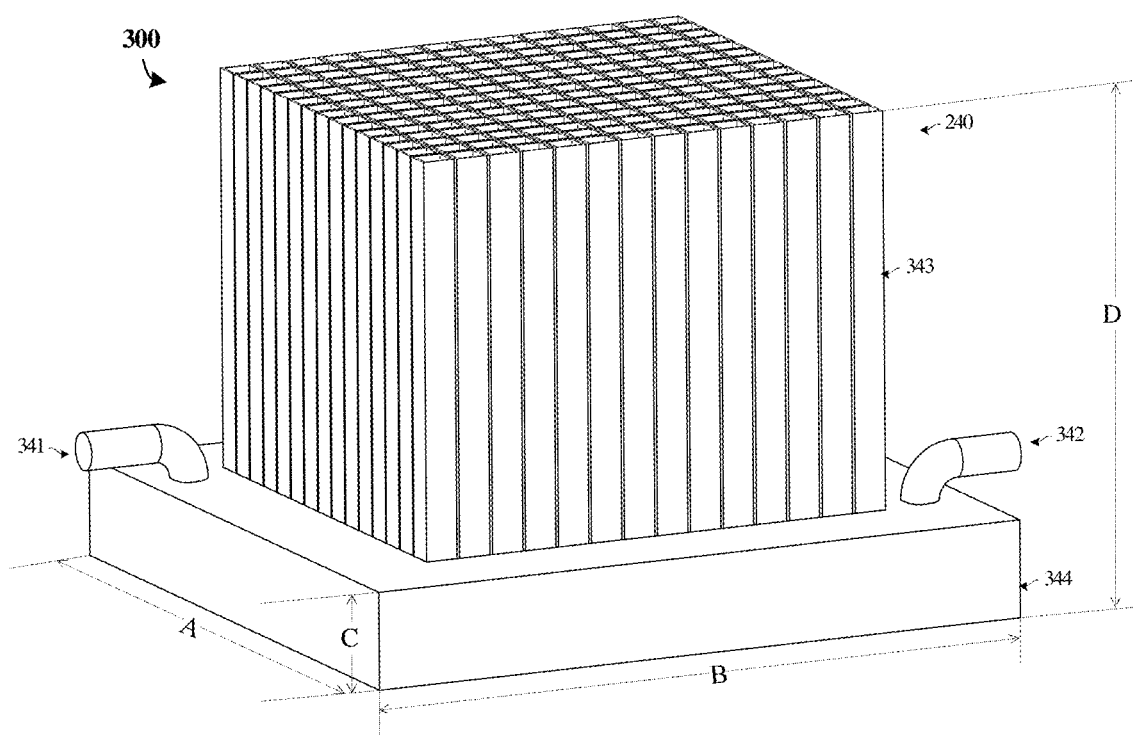
FIG. 3 illustrates an energy conversion unit in an implementation.

FIG. 3 illustrates a detailed view of one example of the heat energy conversion module found in FIG. 2, namely TEG 240. In this example, an array of conversion elements 343 is formed into assembly 300 having at least two electrical terminals 341-342. Assembly 300 also includes base 344. Assembly 300, when included with container 110 and the tritium material, form an RTG. Example dimensions of assembly 300 includes A=0.262 inches, B=0.275 inches, C=0.039 inches, and D=0.198 inches, although it should be understood that the actual dimension can vary based on component selection, container size, and energy output requirements.

In operation, conversion elements 343 receive heat energy from a heat source, such as radioactive decay of tritium. Each of conversion elements 343 can convert, via the Seeback effect, the heat energy into electrical current. When electrically coupled into an array, conversion elements 343 can create a desired amount of aggregate electrical current. Terminals 341-342 can carry the aggregate electrical current to target devices. As mentioned above, the heat energy module can convert heat from radioactive decay into electrical energy, and may comprise a TEG or other components. TEG 240 comprises a Seebeck generator which converts energy from the heat released by decay of a radioactive material into electrical current using a stack or array of thermoelectric materials leveraging thermoelectric effects including the Seeback effect. This example can produce approximately 100 mW of electrical output at terminals 341-342 from about 2 watts of input heat energy (from radioactive decay of tritium), corresponding to a 5% efficiency.

Advantageously, a sealed container, such as discussed for container 110, forms an interior envelope housing a radioactive material, with at least one aperture covered by a diffusion material that allows diffusion of at least one decay product to an exterior environment. The sealed container can hold material inside of the envelope, including solid, liquid, and gas. Thus, the sealed container can hold pressure and be hermetically sealed to prevent release of the radioactive material. However, the diffusion material that covers the aperture, such as a glass material, allows diffusion of a gas produced by the radioactive decay. One or more properties of the glass material, such as material type, thickness, size, dimensions, shape, among other properties, are selected to provide a diffusion rate or permeability of the gas through the material of the window approximately commensurate with the production rate of the gas from the radioactive decay, or to keep a pressure inside the container to below a threshold pressure level. Heat energy from the radioactive decay can be conducted through one or more walls of the sealed container to the exterior environment and to an energy conversion device. This energy conversion device can convert the heat energy into electrical energy for use by a target device.

Figure 4:
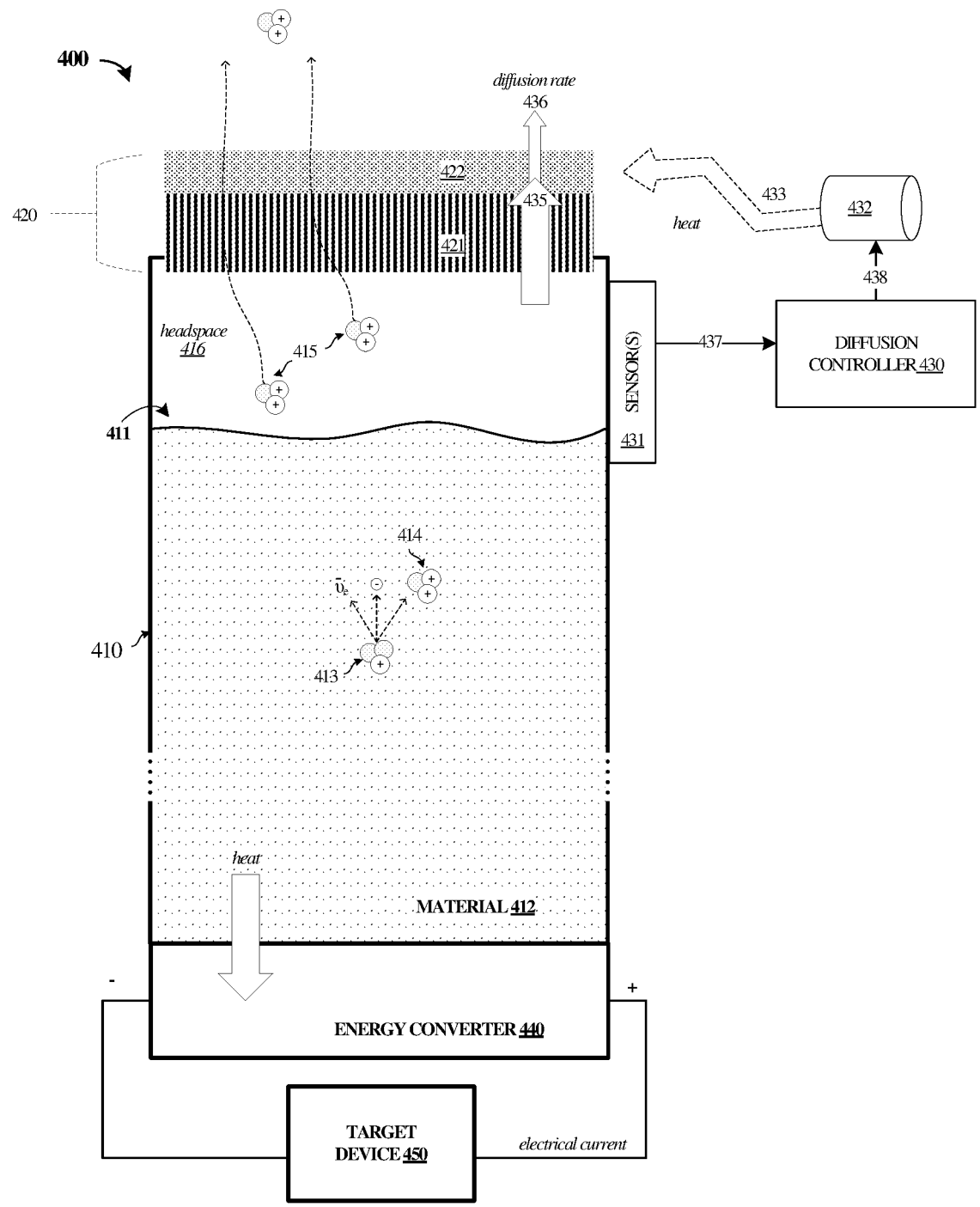
FIG. 4 illustrates a diffusion window an implementation.

FIG. 4 is presented to illustrate various implementations of the diffusion windows or diffusion materials discussed above. FIG. 4 includes system 400 comprising containment vessel 410, diffusion structure 420, diffusion controller 430, sensors 431, heater 432, energy converter 440, and target device 450. System 400 can provide for containment of a radioactive substance while allowing decay product gasses to escape from containment vessel 410 without the use of values, burst discs, or venting. Moreover, thicknesses of walls of containment vessel 410 can be made of a thinner or cheaper material than might otherwise be employed if containment vessel 410 was intended to contain all pressure from decay product gasses over the lifetime of the radioactive material.

Containment vessel 410 comprises a hermetically sealed vessel having interior envelope 411 which houses material 412. Material 412 comprises at least one radioactive substance, such as tritium or tritium infused in a metallic material to form a metallic hydride. Other types of radioactive substances can be employed. During natural decay processes of material 412, decay products are produced. These decay products can include gaseous particles, such as helium-3 or helium-4. In FIG. 4, an example decay process is shown for tritium particle 413 which decays into an electron antineutrino, an electron, and helium-3 nucleus 414. Over time, He-3 nucleus 414 can migrate out of material 411 to headspace region 416 within containment vessel 410 to eventually reach diffusion structure 420. Several example He-3 particles 415 are shown in headspace region 416 of containment vessel 410. As these He-3 particles 415 accumulate within headspace region 416, pressure can build up. However, diffusion structure 420 is provided with containment vessel 410 which allows for diffusion of He-3 particles 415 through a diffusion material that forms a diffusion window.

Diffusion structure 420 includes a laminated arrangement having a first layer and a second layer. The first layer comprises diffusion material 422 that can contain pressure and provides for the diffusion of at least one gas at target diffusion rate 436. The second layer comprises structural material 421 that provides rigidity to diffusion material 422 and is porous to the at least one gas, which corresponds to an essentially free-flowing diffusion rate 435. The porosity of structural material 421 does not hold a pressure for the target gas (e.g. He-3 or He-4) and allows such gas to pass without substantial pressure restriction. Example materials for diffusion material 422 include $SiO_2$, silica glass, silicate glass, fused silica, quartz, soda-lime glass, borosilicate glass, Pyrex, alumosilicate glass, aluminoborosilicate glass, lead glass, polymer material, plastic, or other glass, polymer, and ceramic materials that allows for diffusion of He-3 or He-4.

A rate of diffusion through diffusion material 422 depends on various factors. These factors include a thickness of diffusion material 422 and a pressure of the gas in containment vessel 410, which typically affect the diffusion rate linearly. For example, a thicker material can reduce the diffusion rate, while a higher pressure can increase the diffusion rate. For certain materials mentioned herein, such as certain types of glass, a thickness of 1-2 mm might have too low of a diffusion rate to maintain the pressure within containment vessel 410 below a threshold pressure level. However, if too thin of diffusion material 422 is employed, then structural integrity of diffusion material 422 might be insufficient to hold the target pressure in containment vessel 410 or to hold material 412 in containment vessel 410.

Advantageously, the configuration shown in FIG. 4 employs a composite or laminated arrangement for diffusion structure 420. This laminated arrangement includes diffusion material 422 having a desired thickness to sustain a target diffusion rate 436, which is laminated or bonded to structural material 421. In one example, structural material 421 comprises porous fused silicon (e.g. frit) bonded to diffusion material 422. In another example, an open cell glass foam can be bonded to diffusion material 422. In yet another example, an open cell metallic foam can be bonded to diffusion material 422, with invar being one example material for metallic foam. The bonding or lamination can occur via sintering, sputtering, epitaxial growth, adhesives, partial melting, or other various techniques. In yet further examples, etching or drilling of a thicker layer of a common material is provided to provide pores within a designated thickness of diffusion material 422 to provide both diffusion material 422 and structural material 421. Thus, diffusion material 422 provides for a hermetic sealing with regard to material 412, while structural material 421 does not provide for a hermetic sealing with regard to material 412. In such examples, a thinner diffusion material 422 can be employed, such as 0.1 mm, with structural material 421 being thicker to meet the structural and pressure requirements of containment vessel 410. Although FIG. 4 shows diffusion material 422 on the top and structural material 421 on the bottom and within the hermetic envelope, the arrangement can be reversed in other examples. Thermal expansion coefficients of the materials selected for diffusion material 422 and structural material 421 are typically selected to be similar or within a certain range to prevent or reduce stress between the two layers over a target temperature range. Also, the materials selected should typically have the ability to be bonded or laminated together with regards to material compatibility or similarity.

A diffusion rate, such as target diffusion rate 436, through diffusion material 422 can be set by various properties, such as selection of a material type, material thickness, and material cross-sectional area (surface area) exposed to the target gas for diffusion material 422. Properties of diffusion material 422 might be selected to provide a diffusion rate of the gas through diffusion material 422 approximately commensurate with the production rate of the gas from the radioactive decay, to ensure pressure does not build up within containment vessel 410 above a threshold pressure level. Typically, a diffusion rate through diffusion material 422 is selected to be greater than or equal to a generation rate of the gas by radioactive decay. For some material selections for diffusion material 422, the rate of diffusion scales as the square root of gas material molecular weight. As such, He-4 can diffuse slower than He-3 through certain materials, specifically, He-3 is 15% faster at diffusion in a given material than He-4.

In addition to the properties and factors mentioned above, the diffusion rate can also be a function of the temperature of diffusion material 422. Thus, using selective control of a temperature of diffusion material 422, an adjustable diffusion rate can be achieved for diffusion structure 420. For certain materials, such as the glass and glass-like materials discussed herein, selectively applied heat provides for exponentially dependent diffusion rates for at least He-3 or He-4. This exponential dependence means that a relatively small temperature rise yields a relatively large increase the diffusion rate. Advantageously, by selective heating of diffusion material 422, the diffusion rate can be controlled in some cases and effectively enabled/disabled in other cases. For instance, a material type, thickness, or cross-sectional area of diffusion material 422 can be selected to provide for a low diffusion rate below a lower threshold until heated to a selected temperature rise, which provides for a high diffusion rate above an upper threshold. Also, the selective heating of diffusion material 422 might provide for periodic release of gas pressure from containment vessel 410, such as when constant diffusion above a certain rate is not desired, or during emergency release of gas.

To provide for heating of diffusion material 422, a control loop is provided. This control loop includes diffusion controller 430, sensors 431, and heating element 432. Diffusion controller 430 monitors a pressure of the internal envelop of containment vessel 410, such as within headspace region 416 using one or more sensors 431. Diffusion controller 430 also can monitor a temperature of portions of containment vessel 410 or materials contained therein, as well as a temperature of diffusion structure 420. Based on a pressure of headspace region 416 and a present temperature of diffusion structure 420, diffusion controller 430 can selectively activate or de-activate heating element 432. This selective heating can be controlled to reach a target diffusion rate through diffusion material 422. If a pressure within headspace region 416 is above a threshold pressure, then diffusion controller 430 can activate or increase a heating of diffusion material 422 until a target pressure is reached, the pressure falls below a threshold pressure, or for a preset duration. In further examples, a selective cooling might be employed to reduce a diffusion rate through diffusion material 422 to below a target diffusion rate or threshold.

While selective heating or selective cooling of diffusion material 422 might be an energy intensive process, various forms of heat or cooling might be convenient to containment vessel 410 depending upon the application and environment. Also, the thermal mass of diffusion material 422 might be small enough to not require a large energy input to change temperature. For example, when deployed on a spacecraft or other space-faring device, diffusion controller 430 might have access to heat energy from solar irradiance as well as cooling capability from radiators which dump excess heat into space or into a corresponding vehicle. Other examples might have heating element 432 comprising electric/resistive heating elements which can selectively apply energy (e.g. heat 433) to diffusion material 422. In other examples, a portion of the heat from radioactive decay of material 412 can be selectively directed to diffusion material 422 to increase a diffusion rate of diffusion material 422. This selective direction of heat from material 412 can be provided by mechanical coupling of heat spreaders, heat pipes, or other controllable mechanism under the purview of diffusion controller 430.

Diffusion controller 430 can comprise one or more microprocessors, microcontrollers, and other processing circuitry that retrieves and executes software, such as pressure/temperature monitoring software and diffusion control loop software, from an associated storage system (not shown). Diffusion controller 430 can be implemented within a single processing device but can also be distributed across multiple processing devices or sub-systems that cooperate in executing program instructions. Examples of diffusion controller 430 include general purpose central processing units, application specific processors, and logic devices, as well as any other type of processing device, combinations, or variations thereof. In some examples, diffusion controller 430 comprises a field-programmable gate array (FPGA), application specific integrated circuit (ASIC), application specific processor, discrete logic circuitry, or other microprocessor or data processing and control elements.

Links 437-438 can comprise one or more data communication links or control links, such as one or more data links comprising wireless or wired links. Links 437-438 can comprise various logical, physical, or application programming interfaces. Example links can use metal, glass, optical, air, space, or some other material as the transport media. Links 437-438 can use various data protocols and formats. Links 437-438 can include direct links or may include intermediate networks, systems, or devices, and can include a logical network link transported over multiple physical links.

Heating element 432 can comprise various heating or cooling elements configured to apply or remove heat 433 for diffusion structure 420. Heating element 432 may comprise electrical heating or cooling elements, or may comprise mechanisms which couple heat energy from radioactive decay or solar irradiance to diffusion structure 420. Heating element 432 can also comprise resistive heating elements, solid state heating elements, solid state cooling elements, refrigeration cycle elements, heat pump elements, laser elements, heat spreaders, solar reflectors, solar collectors, heat radiators, or other elements. Heating element 432 can receive control instructions over link 438 for activation or de-activation. Link 438 might also provide power for portions of heating element 432.

Sensors 431 comprise temperature sensors that can sense temperatures of elements of containment vessel 410, headspace region 416, material 412, or diffusion structure 420. Sensors 431 comprise pressure sensors that can sense pressures within the internal envelope of containment vessel 410, such as within headspace region 416. Sensors 431 may also sense ambient temperature and pressure of the environment external to containment vessel 410. Sensors 431 can include electrical interfaces, data interfaces, and other interfaces which communicate sensed parameters over link(s) 437 to diffusion controller 430. Link(s) 437 might also provide power for portions of sensors 431.

Energy converter 440 can comprise any of the energy conversion devices discussed herein, such as RTG elements, TEG elements, betavoltaic elements, heat spreaders, Seeback effect devices, thermocouples, thermopiles, Sterling engines, Peltier effect devices, or Thomson effect devices. Various thermal and electrical interfacing components and materials can be employed to conduct heat from containment vessel 410 to energy converter 440 and to conduct electrical current to target device 450.

Target device 450 receives electrical energy over corresponding electrical links in FIG. 4 and operates using the electrical energy. Target device 450 might comprise any number of different devices, such as sensors, satellites, probes, craft, vehicles, communication devices, or other various devices. Target device 450 can be mechanically coupled to containment vessel 410 to provide for a self-contained system having internally-generated energy for various functional tasks.

The functional block diagrams, operational scenarios and sequences, and flow diagrams provided in the Figures are representative of exemplary systems, environments, and methodologies for performing novel aspects of the disclosure. While, for purposes of simplicity of explanation, methods included herein may be in the form of a functional diagram, operational scenario or sequence, or flow diagram, and may be described as a series of acts, it is to be understood and appreciated that the methods are not limited by the order of acts, as some acts may, in accordance therewith, occur in a different order and/or concurrently with other acts from that shown and described herein. For example, those skilled in the art will understand and appreciate that a method could alternatively be represented as a series of interrelated states or events, such as in a state diagram. Moreover, not all acts illustrated in a methodology may be required for a novel implementation.

The various materials, manufacturing processes, and propellants discussed herein are employed according to the descriptions above. However, it should be understood that the disclosures and enhancements herein are not limited to these materials, manufacturing processes, and propellants, and can be applicable across a range of suitable materials, manufacturing processes, and propellants. Thus, the descriptions and figures included herein depict specific implementations to teach those skilled in the art how to make and use the best options. For the purpose of teaching inventive principles, some conventional aspects have been simplified or omitted. Those skilled in the art will appreciate variations from these implementations that fall within the scope of this disclosure. Those skilled in the art will also appreciate that the features described above can be combined in various ways to form multiple implementations.

What is claimed is:

1. An apparatus, comprising:
a container forming a sealed interior envelope for a radioactive material and having an aperture covered by a window material;
the window material comprising properties selected to provide for diffusion of an isotope of helium produced by radioactive decay of the radioactive material; and
a control system configured to selectively alter the properties of the window material to provide for the diffusion of the isotope of helium according to a selected diffusion rate.

2. The apparatus of claim 1, wherein the window material comprises a material comprising at least one among glass, silicon dioxide ($SiO_2$), fused silica, or polymer.

3. The apparatus of claim 1, wherein the properties of the window material are selected to provide a diffusion rate of the isotope of helium through the window material approximately commensurate with the production rate of the isotope of helium from the radioactive decay.

4. The apparatus of claim 1, wherein the radioactive material comprises tritium, and wherein the isotope of helium comprises helium-3.

5. The apparatus of claim 4, wherein the tritium is included in a metallic material to form a hydride.

6. The apparatus of claim 1, wherein the radioactive material produces alpha particles as a decay product that form helium-4 as the isotope of helium.

7. The apparatus of claim 1, wherein heat energy produced by the radioactive decay of the radioactive material is coupled to a device that converts the heat energy to electrical energy.

8. The apparatus of claim 1, wherein decay products produced by the radioactive decay of the radioactive material are converted to electrical energy.

9. The apparatus of claim 1, wherein the window material comprises a laminated arrangement comprising a diffusion material that provides for the diffusion of the isotope of helium and a structural material that provides rigidity to the diffusion material and is porous to the isotope of helium.

10. The apparatus of claim 1, comprising:
wherein the properties of the window material are selected to provide for the diffusion having a rate at or below a threshold rate; and
wherein the properties of the window material are selectively altered to provide for the selected diffusion rate as higher than the threshold rate.

11. The apparatus of claim 1, comprising:
the control system configured to alter a temperature of the window material to produce the selected diffusion rate.

12. A method, comprising:
forming a container having a sealed interior envelope for a radioactive material and having an aperture covered by a window material;
wherein properties of the window material are selected to provide for diffusion of an isotope of helium produced by radioactive decay of the radioactive material; and selectively altering temperature properties of the window material to provide for the diffusion of the isotope of helium according to a selected diffusion rate.

13. The method of claim 12, wherein the properties of the window material are selected to provide a diffusion rate of the isotope of helium through the window material approximately commensurate with the production rate of the isotope of helium from the radioactive decay.

14. The method of claim 12, wherein the radioactive material comprises tritium, and wherein the isotope of helium comprises helium-3, and wherein the tritium is included in a metallic material to form a hydride.

15. The method of claim 12, wherein the radioactive material produces alpha particles as a decay product that form helium-4 as the isotope of helium.

16. The method of claim 12, further comprising:
coupling heat energy produced by the radioactive decay of the radioactive material through a selected wall of the container to a device that converts the heat energy to electrical energy.

17. The method of claim 12, further comprising:
forming the window material using a laminated arrangement comprising a diffusion material that provides for the diffusion of the isotope of helium and a structural material that provides rigidity to the diffusion material and is porous to the isotope of helium.

18. The method of claim 12, wherein the properties of the window material are selected to provide for the diffusion having a rate at or below a threshold rate; and
wherein the temperature properties of the window material are selectively altered to provide for the selected diffusion rate as higher than the threshold rate.

19. A system, comprising:
a means for forming a sealed interior envelope for a radioactive material;
a means for forming an aperture to the sealed interior envelope covered by a window material, wherein properties of the window material are selected to provide for diffusion of an isotope of helium produced by radioactive decay of the radioactive material; and
a means for selectively altering temperature properties of the window material to provide for the diffusion of the isotope of helium according to a selected diffusion rate.

20. The system of claim 19, wherein the properties of the window material are selected to provide for the diffusion having a rate at or below a threshold rate; and
wherein the temperature properties of the window material are selectively altered to provide for the selected diffusion rate as higher than the threshold rate.

* * * * *